United States Patent
Jarry et al.

(10) Patent No.: US 8,409,967 B2
(45) Date of Patent: Apr. 2, 2013

(54) METHOD FOR MANUFACTURING SEMICONDUCTOR CHIPS FROM A SEMICONDUCTOR WAFER

(75) Inventors: Vincent Jarry, La Membrolle sur Choisille (FR); Patrick Hougron, Parcay Meslay (FR); Dominique Touzet, Savigne sous le Lude (FR); José Mendez, Hommes (FR)

(73) Assignee: STMicroelectronics (Tours) SAS, Tours (FR)

( * ) Notice: Subject to any disclaimer, the term of this patent is extended or adjusted under 35 U.S.C. 154(b) by 130 days.

(21) Appl. No.: 13/153,959

(22) Filed: Jun. 6, 2011

(65) Prior Publication Data
US 2011/0300647 A1      Dec. 8, 2011

(30) Foreign Application Priority Data
Jun. 8, 2010 (FR) ..................... 10 54472

(51) Int. Cl.
*H01L 21/66* (2006.01)

(52) U.S. Cl. ............... 438/460; 257/E21.521; 29/25.01; 225/106

(58) Field of Classification Search .................. 438/460, 438/463; 257/E21.521; 29/25.01; 83/189, 83/861; 225/5, 95, 4, 106
See application file for complete search history.

(56) References Cited

U.S. PATENT DOCUMENTS

| | | | |
|---|---|---|---|
| 5,288,663 A | 2/1994 | Ueki | |
| 2008/0032489 A1* | 2/2008 | Formosa | 438/464 |
| 2008/0070382 A1* | 3/2008 | Chan et al. | 438/464 |

FOREIGN PATENT DOCUMENTS

JP         2006128359 A         5/2006

* cited by examiner

*Primary Examiner* — Caridad Everhart
(74) *Attorney, Agent, or Firm* — Wolf, Greenfield & Sacks, P.C.

(57) ABSTRACT

A method for manufacturing semiconductor chips from a semiconductor wafer, including the steps of: fastening, on a first support frame, a second support frame having outer dimensions smaller than the outer dimensions of the first frame and greater than the inner dimensions of the first frame; arranging the wafer on a surface of a film stretched on the second frame; carrying out wafer processing operations by using equipment capable of receiving the first frame; separating the second frame from the first frame and removing the first frame; and carrying out wafer processing operations by using equipment capable of receiving the second frame.

9 Claims, 3 Drawing Sheets

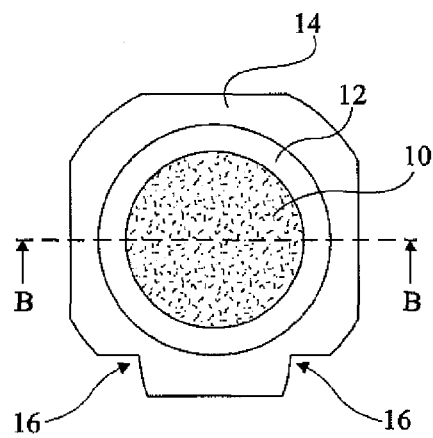
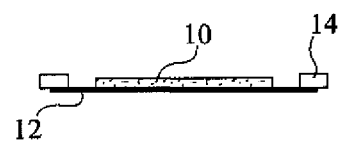
Fig 1A    Fig 1B
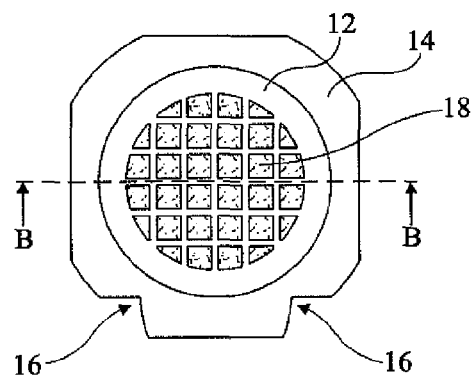
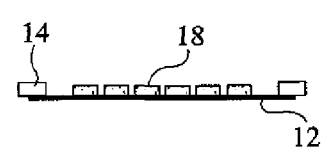
Fig 2A    Fig 2B
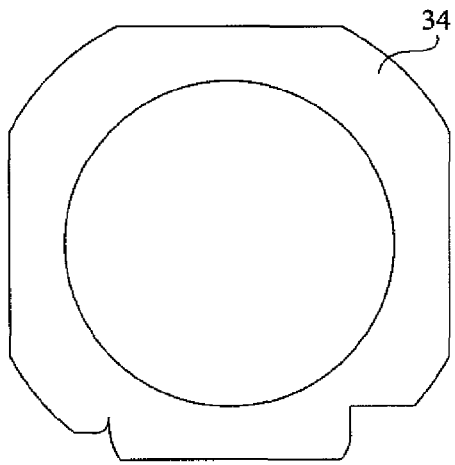
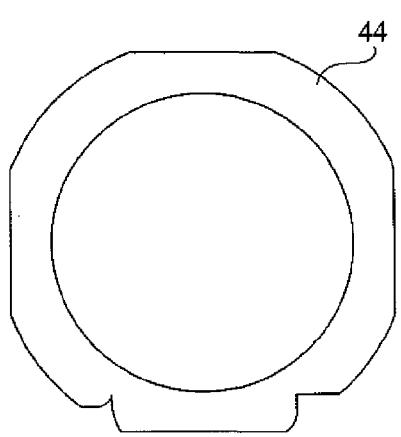
Fig 3    Fig 4

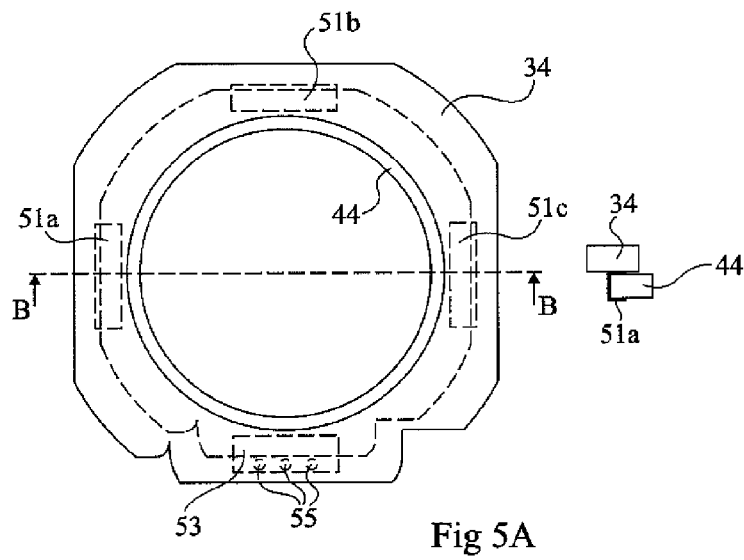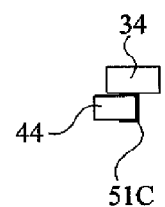
Fig 5A    Fig 5B
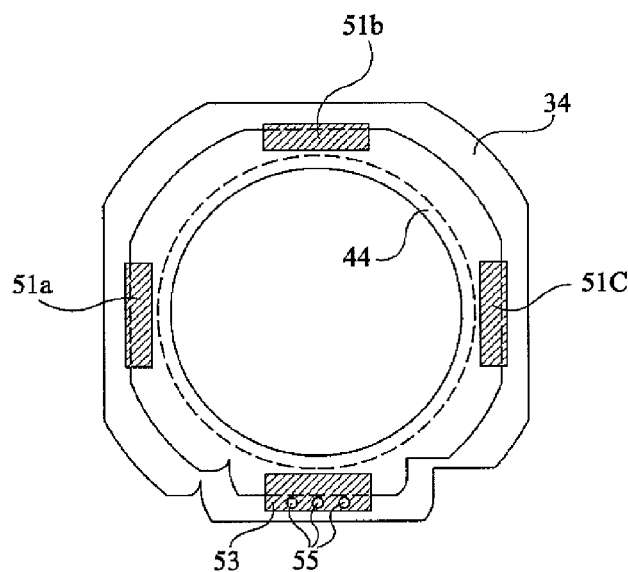
Fig 5C

METHOD FOR MANUFACTURING SEMICONDUCTOR CHIPS FROM A SEMICONDUCTOR WAFER

CROSS REFERENCE TO RELATED APPLICATIONS

This application claims the priority benefit of French patent application number 10/54472, filed on Jun. 8, 2010, entitled "METHOD FOR MANUFACTURING SEMICONDUCTOR CHIPS FROM A SEMICONDUCTOR WAFER," which is hereby incorporated by reference to the maximum extent allowable by law.

BACKGROUND OF THE INVENTION

1. Field of the Invention

The present invention relates to a method for manufacturing semiconductor chips from a semiconductor wafer.

2. Discussion of the Related Art

The manufacturing of semiconductor chips especially comprises steps during which components and interconnect metallizations are formed inside and on top of a semiconductor wafer, followed by a step during which the wafer is cut into individual chips, for example, by means of a saw. Various individual chip testing steps are generally provided after the cutting.

FIGS. 1A, 1B and 2A, 2B schematically illustrate steps of a method for cutting a semiconductor wafer 10 into individual chips by means of a saw. FIGS. 1A and 2A are top views and FIGS. 1B and 2B respectively are cross-section views along planes B-B of FIGS. 1A and 2A.

FIGS. 1A and 1B illustrate an initial step in which wafer 10 is arranged on a surface of an adhesive film 12 stretched on a support frame 14. Generally, wafer 10 has an approximately round shape and frame 14 has a round inner contour with a diameter greater than the diameter of wafer 10. In this example, the outer contour of frame 14 has a generally approximately square shape with rounded corners and comprises location notches 16.

The specific shape of frame 14, and more specifically of its outer contour, enables to accurately position the wafer in a processing machine, for example, a sawing machine. In a given production line, frame 14 generally is an element of standard shape and dimension, used at various steps of the manufacturing during which the wafer should be maintained on a support. Thus, the various machines of a given manufacturing line are provided to receive a type of support frame 14, of given shape and dimensions.

FIGS. 2A and 2B illustrate the actual operation of cutting of wafer 10 into individual chips 18. The cutting is conventionally performed by means of a circular saw (not shown) running through the wafer along a grid of lines and columns. The cutting is performed across the entire thickness of the wafer and stops in the upper portion of adhesive film 12, without however cutting this film. It should be noted that, in practice, a semiconductor wafer comprises a much greater number of elementary chips 18 than what has been shown. It should be noted that generally, the semiconductor wafer is not perfectly circular but has a flat side, not shown, enabling to align all wafers in the same way with respect to frame 14.

After the wafer has been cut, the individual chips remain on frame 14, and other manufacturing steps may be provided, during which the cut wafer is processed in machines capable of receiving frame 14. Such steps for example are a visual inspection of the chips, a probe test, a marking of defective chips, etc. Adhesive film 12 especially enables chips 18 to remain in place during these steps and during subsequent transportations of frame 14.

In some cases, the user or the customer desires to receive the cut chips to assemble them in various electronic devices. The chips are then shipped on the support frame 14 on which they have been cut. On reception of the chips, the test and/or inspection steps may be implemented again by using equipment capable of receiving frame 14. The actual mounting of the chips, for example, their mounting on printed circuit boards, is also carried out by means of machines capable of receiving frame 14.

The different manufacturers and users of semiconductor chips do not necessarily use the same support frame standards. Now, generally, given equipment is equipped to receive frames of a single standard. Accordingly, in such a production system, a manufacturer of semiconductor chips using a given type of frame can only sell his production to users equipped to receive this type of frame.

FIGS. 3 and 4 are top views schematically showing, respectively, a frame 34 and a frame 44, corresponding to two standards much used in the art to support wafers having a 20-cm diameter (approximately 8 inches), that is, standard FF-108 and standard FF-105. Frames 34 and 44 have approximately identical general shapes but different dimensions. The general shapes of frames 34 and 44 are similar. Frame 44 has dimensions slightly smaller than the dimensions of frame 34, and in particular outer dimensions smaller than the outer dimensions of frame 34 but greater than the inner diameter of frame 34. In this example, the inner diameter of frame 44 is slightly smaller than the inner diameter of frame 34. The difference in outer dimensions especially results in that the machines capable of receiving frame 34 are not capable of receiving frame 44, and conversely.

It would be desirable for a manufacturer having equipment capable of receiving frame 34 to be able to sell his production to a user having equipment capable of receiving frame 44 (smaller than frame 34) without for one or the other of the manufacturer and of the user to have to modify his machines.

SUMMARY OF THE INVENTION

Thus, an embodiment provides a method for manufacturing semiconductor chips from a semiconductor wafer, which overcomes at least some of the disadvantages of existing methods.

An embodiment provides such a method capable of producing, in a production line capable of processing semiconductor wafers arranged on a frame of a first type, semiconductor chips arranged on a support frame of a second type having smaller outer dimensions than the frame of the first type.

An embodiment provides such a method which is easy to implement.

Thus, an embodiment provides a method for manufacturing semiconductor chips from a semiconductor wafer, comprising the steps of: fastening, on a first support frame, a second support frame having outer dimensions smaller than the outer dimensions of the first frame and greater than the inner dimensions of the first frame; arranging the wafer on a surface of a film stretched on the second frame; carrying out wafer processing operations by using equipment capable of receiving the first frame; separating the second frame from the first frame and removing the first frame; and carrying out wafer processing operations by using equipment capable of receiving the second frame.

According to an embodiment, the processing operations in equipment compatible with the first frame comprise a step during which the wafer is cut into semiconductor chips and at least one semiconductor chip test step.

According to an embodiment, the processing operations in equipment compatible with the second frame comprise a step of assembly of the semiconductor chips in electronic devices.

According to an embodiment, the first frame comprises, on the side of a surface, guiding and fastening means capable of receiving the second frame, these means being contained, in top view, within the outer contour of the first frame.

According to an embodiment, the outer and inner contours of the first frame respectively have a square general shape with rounded corners and a circular shape.

According to an embodiment, the guiding and fastening means comprise: three guide rails fastened in the vicinity of three sides of the square forming the outer contour of the first frame, these guide rails delimiting a space inside of which the second frame is capable of being inserted; and a removable lug capable of being fastened in the vicinity of the fourth side of the square forming the outer contour of the first frame.

According to an embodiment, the step during which the second frame is fastened to the first frame comprises the operations of: removing the removable lug from the first frame; inserting the second frame between the guide rails of the first frame; and fastening the removable lug to the first frame.

According to an embodiment, the separation step comprises the operations of: removing the removable lug from the first frame; and removing the second frame from the guide rails of the first frame.

Another embodiment provides a support frame for a semiconductor wafer, comprising, on the side of a surface, fastening means capable of receiving a second frame of outer dimensions respectively smaller than and greater than the outer and inner dimensions of the support frame, these means being contained, in top view, within the outer contour of the support frame.

According to an embodiment, this support frame has an outer contour of generally square shape with rounded corners and a circular inner contour, said means comprising: three guide rails fastened in the vicinity of three sides of the square forming the outer contour of the support frame, these guide rails delimiting a space inside of which the second frame is capable of being inserted; and a removable lug capable of being fastened in the vicinity of the fourth side of the support frame.

The foregoing and other objects, features, and advantages will be discussed in detail in the following non-limiting description of specific embodiments in connection with the accompanying drawings.

BRIEF DESCRIPTION OF THE DRAWINGS

FIGS. 1A, 1B and 2A, 2B, previously described, schematically illustrate steps of a conventional method for cutting a semiconductor wafer into individual chips by means of a saw;

FIG. 3, previously described, is a top view schematically showing an example of a first type of semiconductor wafer support frame;

FIG. 4, previously described, is a top view schematically showing an example of a second type of a semiconductor wafer support frame, of dimensions smaller than the dimensions of the support frame of FIG. 3; and FIGS. 5A, 5B, 5C, 6A, 6B, 7A, 7B, and 8A, 8B schematically illustrate steps of a method for manufacturing semiconductor chips, capable of producing, in a production line specifically adapted to process semiconductor wafers arranged on a first frame, chips arranged on another frame of smaller outer dimensions.

DETAILED DESCRIPTION

Figures 6A, 6B:
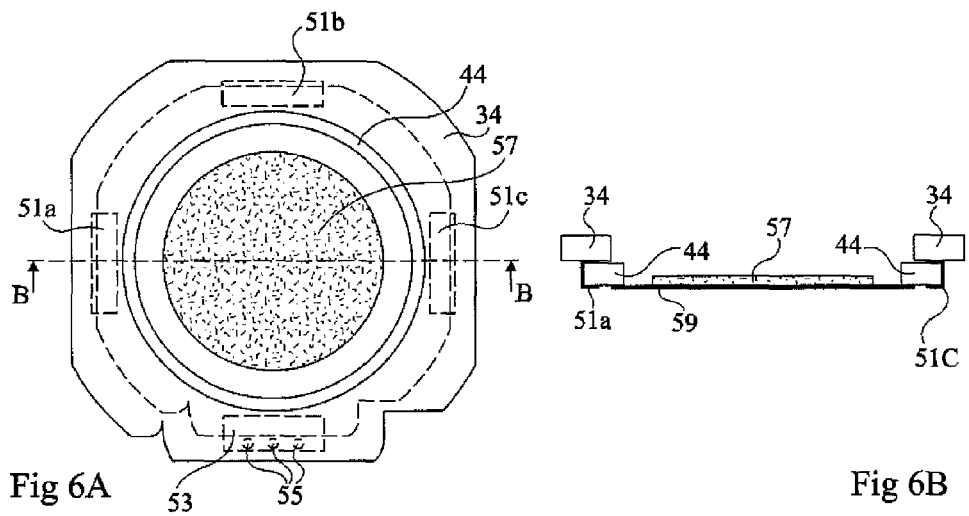

For clarity, the same elements have been designated with the same reference numerals in the different drawings and, further, the various drawings are not to scale.

FIGS. 5A, 5B, 5C, 6A, 6B, 7A, 7B, and 8A, 8B schematically illustrate steps of a method for manufacturing semiconductor chips, capable of producing, in a production line specifically adapted to process semiconductor wafers arranged on a frame 34 of the type described in relation with FIG. 3, chips arranged on a frame 44 of the type described in relation with FIG. 4, of outer dimensions smaller than those of frame 34.

FIGS. 5A, 6A, 7A, and 8A are top views, FIG. 5B, 6B, 7B, and 8B respectively are cross-section views along planes B-B of FIGS. 5A, 6A, 7A, and 8A, and FIG. 5C is a bottom view corresponding to FIG. 5A.

FIGS. 5A, 5B, and 5C illustrate a step during which frames 34 and 44 are superposed, and then fastened to each other.

In this example, frame 34 comprises three guide rails 51*a* to 51*c* previously fastened to its lower surface, for example, by welding or by gluing, in the vicinity of three side of the square forming the outer contour of the frame. Guide rails 51*a*, 51*b*, and 51*c* delimit a space inside of which frame 44 is capable of being inserted so that frames 34 and 44 are superposed, that is, their inner contours have approximately the same center in top view. The interval between two guide rails 51*a* and 51*c* fastened to opposite sides of frame 34 substantially corresponds to the outer width of frame 44, and the distance between the center of frame 34 and third guide rail 51*b* substantially corresponds to half the outer width of frame 44.

A removable lug 53 is capable of being fastened, for example by means of screws 55 (three screws in the present example), to the lower surface of frame 34, in the vicinity of the side of frame 34 which is not provided with a guide rail 51 (on the side of frame 34 opposite to guide rail 51*b*). For this purpose, tapped holes may have been drilled in frame 34. As an example, when lug 53 is screwed to frame 34, the interval between lug 53 and guide rail 51*b* is substantially equal to the outer width of frame 44.

To superpose frame 44 to frame 34, mounting lug 53 is removed and frame 44 is inserted between guide rails 51*a*, 51*b*, and 51*c* to have the centers of the frames coincide (in top view). To lock frame 44 in this position, mounting lug 53 is put back in place and screwed to frame 34. At the end of this assembly step, frames 34 and 44 are superposed and firmly fastened to each other. In this example, the lower surface of frame 34 is placed against the upper surface of frame 44.

Guide rails 51*a* to 51*c* and mounting lug 53 are provided to remain within the outer contour of frame 34. Thus, in top view, the outer contour of the assembly formed by frames 34 and 44 corresponds to the outer contour of frame 34. Such an assembly is compatible with processing machines capable of receiving frame 34. It should be noted that the thickness difference between this assembly and frame 34 alone poses no problem of compatibility with existing equipment. It will however preferably be provided to use a specifically thinned down frame 34 so that the thickness of the assembly is as close as possible to the thickness of a standard frame 34.

FIGS. 6A and 6B illustrate a step during which a semiconductor wafer 57 is arranged on a surface of an adhesive film 59 stretched on frame 44. The adhesiveness of film 59 allows an easy bonding of the film to the frame and of the wafer to the film. However, if film 59 is not adhesive, it may be provided to bond the film to the frame and/or the wafer to the film by means of glue or of any other adapted bonding means. In this example, film 59 is bonded on the lower surface side of frame 44.

Figures 7A, 7B:
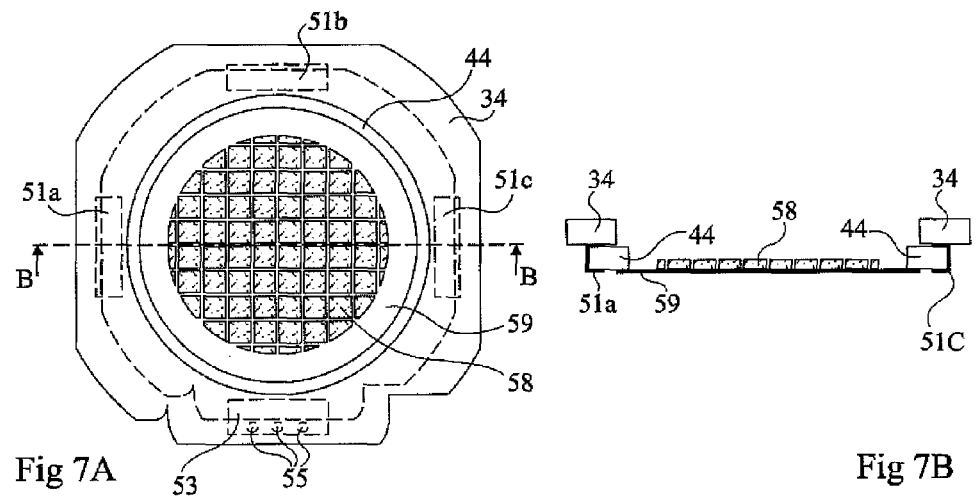

FIGS. 7A and 7B illustrate the step during which the semiconductor wafer is cut into individual chips 58. The cutting is conventionally performed by means of a circular saw (not shown) running through the wafer along a grid of lines and columns. Any other adapted cutting means may however be used. In this example, the cutting is performed across the entire thickness of the wafer and stops in the upper portion of adhesive film 59, without however cutting this film.

Figures 8A, 8B:
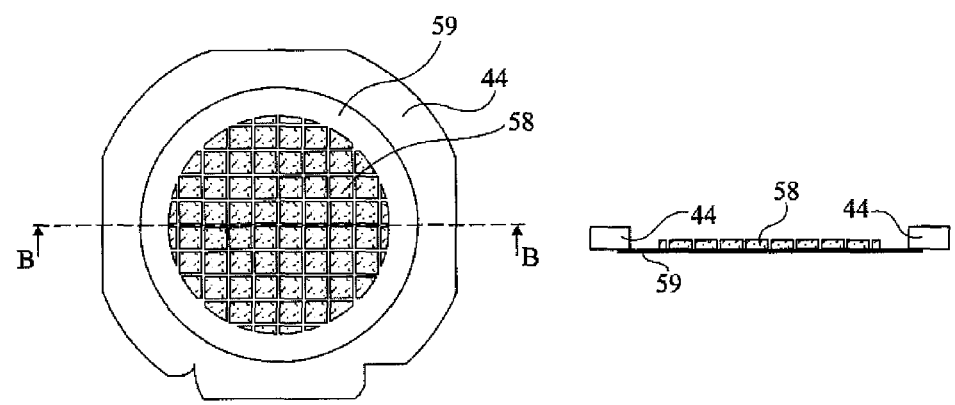

FIGS. 8A and 8B illustrate a final step where frames 34 and 44 are separated and frame 34 is removed. To achieve this, removable mounting lug 53 (FIG. 7A) is unscrewed and frame 44 supporting film 59 and individual chips 58 is removed from the space delimited by guide rails 51a to 51c (FIG. 7A).

The wafer cut into individual chips 58 can then be shipped to a user on frame 44, for example, for a mounting of chips 58 in electronic devices by means of equipment which is not compatible with frame 34 but which is capable of receiving frame 44.

It should be noted that other steps, not shown, for example, inspection, testing and/or marking steps, may be provided between the wafer cutting (FIGS. 7A, 7B) and the separation of the frames (FIGS. 8A, 8B).

An advantage of such a method is that it enables, by a simple operation, to produce, in a manufacturing line specifically adapted to receiving frames of a first type, semiconductor chips arranged on a frame of a second type having dimensions smaller than those of the frames of the first type.

Specific embodiments have been described. Various alterations, modifications and improvements will readily occur to those skilled in the art.

In particular, a method comprising a step during which a second smaller frame is fastened to a first frame, a step during which a wafer arranged on the second frame is cut by means of equipment compatible with the first frame, and a step of frame separation to use equipment compatible with the second frame have been described herein. The present invention is not limited to this specific case. It will be within the abilities of those skilled in the art to implement the provided method in the case where the steps of processing, by means of equipment compatible with the first frame, of a wafer arranged on the second frame, are steps other than the cutting and/or test steps. Further, the present invention is not limited to the above-mentioned case in which the processing steps implemented by means of equipment compatible with the second frame, after separation of the frames, are steps of assembly of the cut chips.

Further, the frames may have any other shape than those shown and described hereabove, provided however for the outer dimensions of the second frame to be smaller than the outer dimensions of the first frame and greater than the inner dimensions of the first frame.

Moreover, it will be within the abilities of those skilled in the art to implement the desired operation by using systems for fastening the second frame to the first frame other than the above-described system. It will however be ascertained for the used fastening system to remain contained within the outer contour of the first frame.

Such alterations, modifications and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing semiconductor chips from a semiconductor wafer, comprising the steps of:
   a) fastening, on a first support frame, a second support frame having outer dimensions smaller than the outer dimensions of the first frame and greater than the inner dimensions of the first frame;
   b) arranging the wafer on a surface of a film stretched on the second frame;
   c) carrying out wafer processing operations by using equipment capable of receiving the first frame;
   d) separating the second frame from the first frame and removing the first frame; and
   e) carrying out wafer processing operations by using equipment capable of receiving the second frame.

2. The method of claim 1, wherein the processing operations carried out at step c) comprise a step during which the wafer is cut into semiconductor chips and at least one semiconductor chip test step.

3. The method of claim 1, wherein the operations carried out at step e) comprise a step of mounting the semiconductor chips in electronic devices.

4. The method of claim 1, wherein the first frame comprises, on the side of a surface, guiding and fastening means capable of receiving the second frame, said guiding and fastening means being contained, in top view, within the outer contour of the first frame.

5. The method of claim 4, wherein the outer and inner contours of the first frame respectively have a square general shape with rounded corners and a circular shape.

6. The method of claim 5, wherein said guiding and fastening means comprise:
   three guide rails fastened in the vicinity of three sides of the square forming the outer contour of the first frame, these guide rails delimiting a space inside of which the second frame is capable of being inserted; and
   a removable lug capable of being fastened in the vicinity of the fourth side of the square forming the outer contour of the first frame.

7. The method of claim 6, wherein step a) comprises the operations of:
   removing the removable lug from the first frame;
   inserting the second frame between the guide rails of the first frame; and
   fastening the removable lug to the first frame.

8. The method of claim 6, wherein step d) comprises the operations of:
   removing the removable lug from the first frame; and
   removing the second frame from the guide rails of the first frame.

9. A support frame for a semiconductor wafer, comprising, on the side of a surface, fastening means capable of receiving a second frame of outer dimensions respectively smaller than and greater than the outer and inner dimensions of the support frame, said fastening means being contained, in top view, within the outer contour of the support frame, wherein the support frame has an outer contour of generally square shape with rounded corners and a circular inner contour, said fastening means comprising:
   three guide rails fastened in the vicinity of three sides of the square forming the outer contour of the support frame, these guide rails delimiting a space inside of which the second frame is capable of being inserted; and
   a removable lug capable of being fastened in the vicinity of the fourth side of the support frame.

* * * * *